United States Patent
Mo et al.

(10) Patent No.: US 9,172,018 B2
(45) Date of Patent: Oct. 27, 2015

(54) ISLANDED CARRIER FOR LIGHT EMITTING DEVICE

(75) Inventors: Qingwei Mo, Sunnyvale, CA (US); Dirk Paul Joseph Vanderhaeghen, Los Gatos, CA (US)

(73) Assignee: Koninklijke Philips N.V., Eindhoven (NL)

( * ) Notice: Subject to any disclaimer, the term of this patent is extended or adjusted under 35 U.S.C. 154(b) by 81 days.

(21) Appl. No.: 13/878,432

(22) PCT Filed: Nov. 14, 2011

(86) PCT No.: PCT/IB2011/055063
§ 371 (c)(1),
(2), (4) Date: Apr. 9, 2013

(87) PCT Pub. No.: WO2012/066461
PCT Pub. Date: May 24, 2012

(65) Prior Publication Data
US 2013/0221386 A1   Aug. 29, 2013

Related U.S. Application Data

(60) Provisional application No. 61/415,395, filed on Nov. 19, 2010.

(51) Int. Cl.
*H01L 33/00* (2010.01)
*H01L 33/62* (2010.01)
*H01L 33/64* (2010.01)

(52) U.S. Cl.
CPC ............ *H01L 33/62* (2013.01); *H01L 33/647* (2013.01); *H01L 2224/16* (2013.01); *H01L 2224/48091* (2013.01); *H01L 2224/48472* (2013.01); *H01L 2933/0066* (2013.01)

(58) Field of Classification Search
CPC ........................................................ H01L 33/00
USPC ............................... 257/98–103; 438/28, 104
See application file for complete search history.

(56) References Cited

U.S. PATENT DOCUMENTS

| | | | |
|---|---|---|---|
| 2006/0133044 A1* | 6/2006 | Kim et al. | 361/704 |
| 2007/0228686 A1 | 10/2007 | Gerstenslager et al. | |
| 2009/0189174 A1* | 7/2009 | Lee et al. | 257/99 |
| 2010/0025718 A1 | 2/2010 | Shi | |
| 2010/0038662 A1* | 2/2010 | Fushimi et al. | 257/98 |
| 2011/0012153 A1* | 1/2011 | Kim | 257/98 |
| 2011/0062474 A1* | 3/2011 | Chen et al. | 257/98 |
| 2011/0101405 A1* | 5/2011 | Chang et al. | 257/99 |

FOREIGN PATENT DOCUMENTS

| | | | |
|---|---|---|---|
| EP | 2081238 A1 | 7/2009 | |
| JP | 2007073575 A | 3/2007 | |
| WO | 2006065007 A1 | 6/2006 | |
| WO | WO 2009051178 A1 * | 4/2009 | |

* cited by examiner

*Primary Examiner* — Cheung Lee
*Assistant Examiner* — Frederick B Hargrove

(57) ABSTRACT

A low-cost conductive carrier element provides structural support to a light emitting device (LED) die, as well as electrical and thermal coupling to the LED die. A lead-frame is provided that includes at least one carrier element, the carrier element being partitioned to form distinguishable conductive regions to which the LED die is attached. When the carrier element is separated from the frame, the conductive regions are electrically isolated from each other. A dielectric may be placed between the conductive regions of the carrier element.

16 Claims, 4 Drawing Sheets

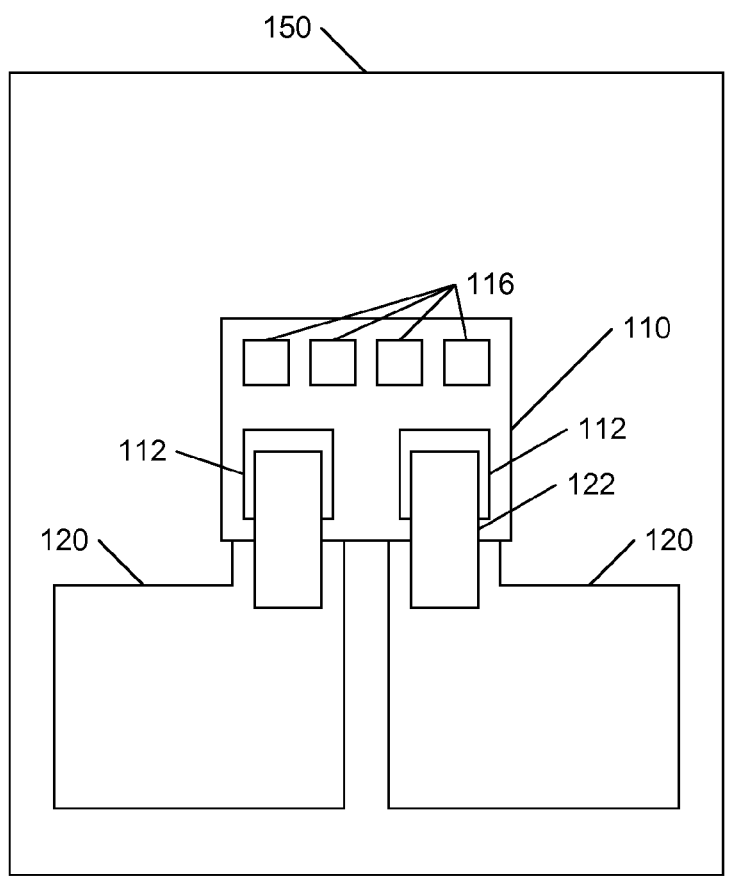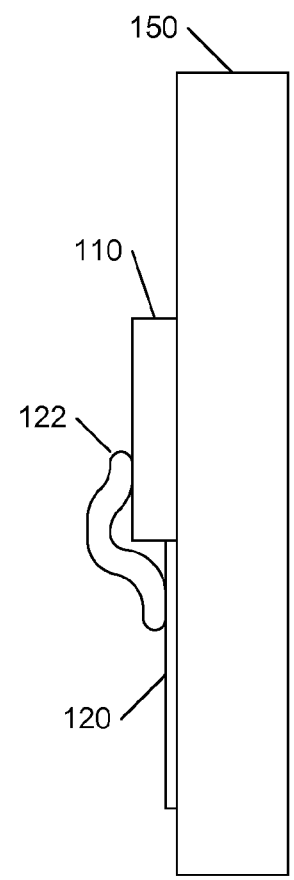
FIG. 1A
PRIOR ART
FIG. 1B
PRIOR ART
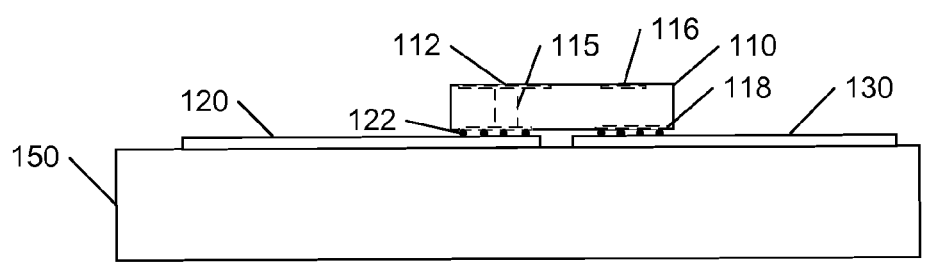
FIG. 1C
PRIOR ART

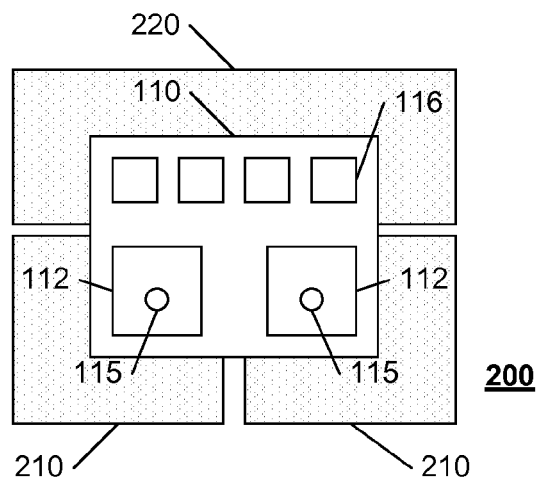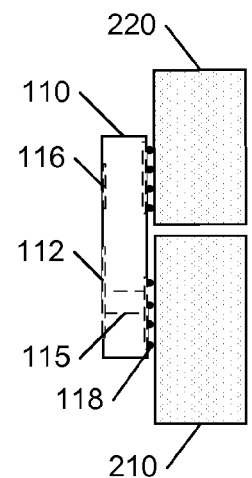
FIG. 2A  FIG. 2B
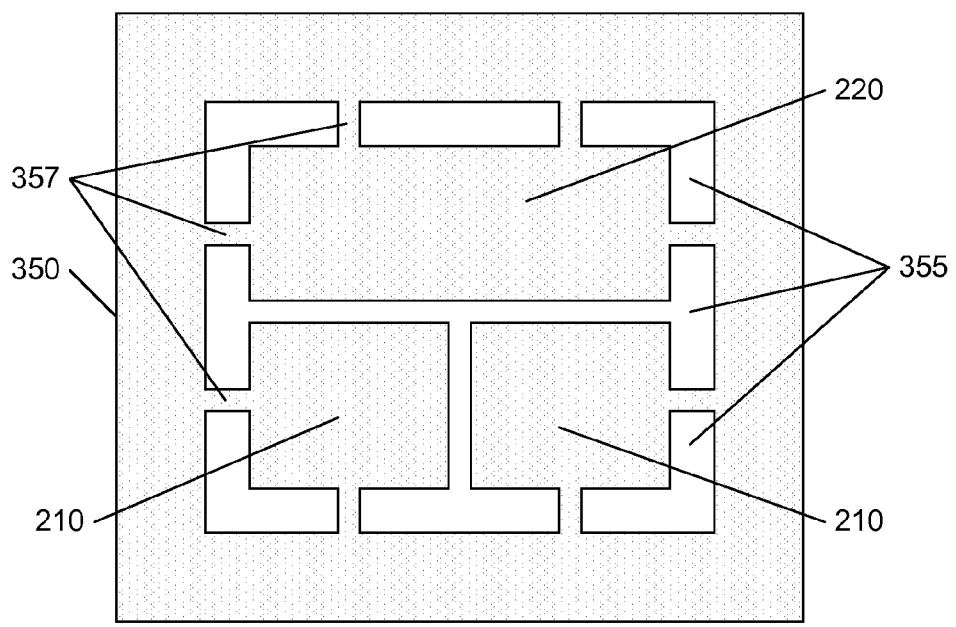
FIG. 3

ISLANDED CARRIER FOR LIGHT EMITTING DEVICE

BACKGROUND AND SUMMARY OF THE INVENTION

This invention relates to the field of Integrated Circuit (IC) fabrication and assembly, and in particular to the fabrication of light emitting device (LED).

As the light emitting capabilities of semiconductor light emitting devices (LEDs) continues to improve, their use in conventional lighting applications continues to increase, as does the competitive pressures to provide reliable, long-lasting products in a cost-effective manner. Even though the cost of LED products is relatively low, the savings of even a few cents per device can have a significant impact on profit margin, due to the increasingly growing market for these devices.

Advances have continued to be made in reducing the size of the individual die that provides the light emitting device, thereby reducing the material costs, but handling considerations require that the die be mounted on a larger substrate. That is, for example, although semiconductor manufacturers have equipment that can pick and place individual dies that may be as small as 1 mm×1 mm, and provide connections to contacts on each die, the equipment that is conventionally used for printed circuit manufacturing is not suitable for placing or connecting such dies. In like manner, light emitting devices are often plug-in replaceable items, and need to be large enough to be gripped by human hands.

FIGS. 1A-1B illustrate an example substrate 150 for mounting a LED die 110. The substrate 150 is commonly a ceramic, such as aluminum nitrate (AlN) or Alumina ($Al_2O_3$), and the combination of a die 110 and substrate 150 is typically referred to as a Device on Ceramic (DoC).

The example LED die 110 of FIG. 1 illustrates the use of four light emitting elements 116. Contacts 112 enable the coupling of the light emitting elements to an external source of power. In this example, pressure-clips 122 hold the die 110 to the substrate 150, as well as providing electrical coupling to the contacts 112. The use of pressure clips facilitates the replacement of the die 110.

Pads 120 provide for attaching the substrate mounted LED device to an external source of power, and may be used, for example, as bond pads for bonding the device to a printed circuit board or similar structure. The bond pads 120 provide the same function as the contacts 112, but, as noted above, are significantly larger, to facilitate common printed circuit board manufacturing equipment and techniques.

The substrate 150 also serves as a heat sink for dissipating the heat generated by the light emitting elements 116.

FIG. 1C illustrates an alternative arrangement, wherein the LED die 110 is soldered to the pads 120 on the substrate 150, via solder elements 122. In this example embodiment, one or more vias 115, or other internal routing in the die 110, provide the coupling to the light emitting elements 116. In the example of FIG. 1C, the upper contacts 112 are also provided, so that the LED die can be used in either of the configurations of FIG. 1B or 1C.

The example of FIG. 1C also illustrates the use of a heat sink pad 130 to which the LED die is soldered. This arrangement will typically provide for an improved thermal coupling between the LED die 110 and the substrate 150, but generally requires a corresponding solderable heat transfer contact 118 on the lower surface of the die 110.

Although the placing of conductive traces on ceramic, such as the pads 120, 130, is a mature technology, there is a cost involved with the fabrication of ceramic substrates with such pads 120, 130, as well as some risk of separation of the pads 120, 130 from the substrate due to the mismatch between the thermal coefficient of the metals commonly used to provide these pads and the thermal coefficient of the ceramic substrate.

SUMMARY OF THE INVENTION

It would be advantageous to provide a lower cost light emitting product. It would also be advantageous to provide a light emitting product with potentially higher reliability and/or longer operational life. It would also be advantageous to provide a cost effective method of producing such light emitting products.

These advantages, and others, can be realized by a process that uses a low-cost conductive carrier element that provides structural support to the LED die, as well as electrical and thermal coupling to the LED die. A lead-frame is provided that includes at least one carrier element, the carrier element being partitioned to form distinguishable conductive regions to which the LED die is attached. When the carrier element is separated from the frame, the conductive regions are electrically isolated from each other. A dielectric may be placed between the conductive regions of the carrier element.

BRIEF DESCRIPTION OF THE DRAWINGS

The invention is explained in further detail, and by way of example, with reference to the accompanying drawings wherein:

FIGS. 1A-1C illustrate two conventional die on ceramic (DoC) arrangements.

FIGS. 2A-2B illustrate an example die on conductive carrier arrangement.

FIG. 3 illustrates an example lead frame that includes a carrier structure comprising three distinguishable conductive regions.

Throughout the drawings, the same reference numerals indicate similar or corresponding features or functions. The drawings are included for illustrative purposes and are not intended to limit the scope of the invention.

DETAILED DESCRIPTION

Figure 4:
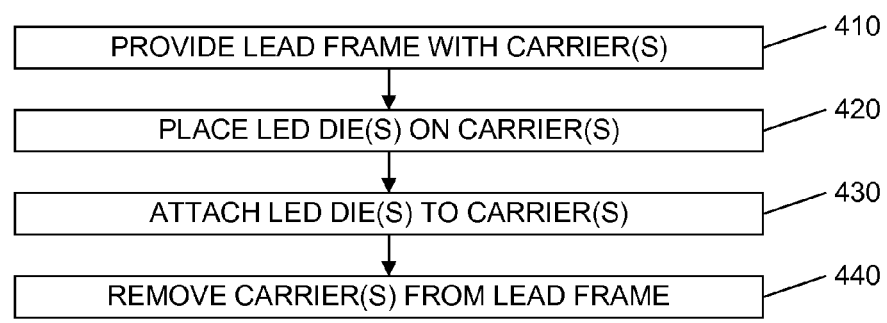
FIG. 4 illustrates an example flow diagram for providing carrier-based light emitting devices.

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Also in the following description, commonly used materials and processes are referenced to facilitate better and/or easier understanding of the principles presented herein, although one of skill in the art will recognize that the principles of this invention are not limited to these references.

FIGS. 2A-2B illustrate an example die on conductive carrier arrangement. In this example, the LED die 110 is mounted on a conductive carrier structure 210-220 that provides both structural support and electrical and thermal coupling to the die 110. The carrier structure in this example includes two electrical conductors 210 and a thermal transfer conductor 220.

In this example embodiment, the LED die 110 may be soldered to the conductors 210, as well as conductor 220, using conventional SMD (surface mount device) solder reflow techniques. Because the conductors 210 are conductive, electrical coupling from an external source to the LED die 110 can be achieved using any accessible side or edge of these conductors 210. In like manner, thermal coupling can be achieved using any accessible side or edge of conductor 220.

FIG. 3 illustrates an example lead frame 350 that includes a carrier structure comprising three distinguishable conductive regions, corresponding to the conductors 210, 220 in FIGS. 2A-2B. That is, the lead frame 350 includes slits or openings 355 in a pattern that defines the intended shape and placement of the conductors 210, 220 for coupling to the LED die 110. Tabs 357 between the openings 355 keep the conductors 210, 220 attached to the overall frame structure. The lead frame 350 may be, for example, a sheet of copper that is thick enough (e.g. greater than 0.75 mm, preferably 1.5 mm, depending on size) to provide the primary structural support for the light emitting device 200 of FIG. 2, although other conductive material may be used.

For clarity, the term 'region' is used herein to refer to the area on the frame that will eventually become the intended conductors for the carrier-based light emitting device, such as device 200 in FIG. 2A. Because these regions and the eventual conductors are the same elements, the same reference numerals 210, 220 will be used when referencing either the region on the frame, or the conductor on the device. In like manner, because the combination of these conductors 210, 220 forms the overall carrier structure, the combination will be referenced as carrier structure 210-220.

The use of this lead frame 350 is best understood with reference to the flow diagram of FIG. 4. In this example, FIG. 4 is described using the reference numerals of the example lead frame 350 and LED die 110, although one of skill in the art will recognize that the flow is not limited to this particular example.

At 410, the lead frame 350 with carrier structures 210-220 is provided. At 420, LED die(s) 110 are placed on the carrier structures 210-220. Typically one LED die 110 is placed on each carrier structure 210-220, although multiple LED dies may be mounted on a single carrier structure.

At 430, the LED die 110 is attached to the corresponding conductive regions 210, 220 of the carrier structure 210-220, typically using SMD solder reflow techniques, although other means of coupling the LED die 110 to these regions 210, 220 may be used. For example, if the LED die does not include vias 115 or other means of coupling via its bottom surface, the contacts 112 on the die may be wire bonded to the regions 210, using conventional wire bonding techniques.

In some embodiments, the LED die 110 may not be attached, per se, to the region 220, relying on mechanical contact, perhaps augmented with thermal transfer paste or compound to assure an efficient thermal coupling between the LED die 110 and the region 220. In like manner, in some embodiments, the lead frame 350 may be plated with gold, at least at the points of contact to the LED die 110, to assure a reliable electrical coupling between the LED die 110 and the regions 210.

At 440, the carrier structure 210-220 (with attached LED die 110) is separated from the frame 350, typically by sawing off the tabs 357 that connect the carrier structure 210-220 to the remainder of the frame 350, thereby producing the light emitting device 200 of FIG. 2A-2B.

Figure 5:
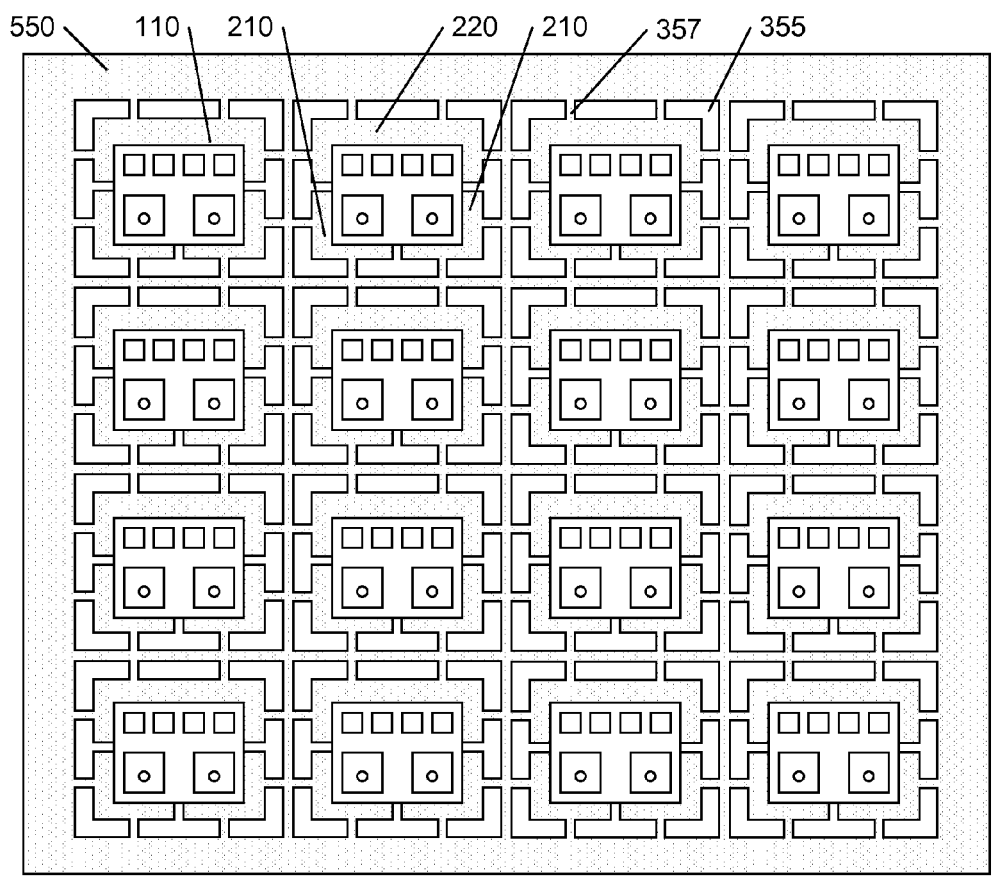
FIG. 5 illustrates an example lead frame that includes multiple carrier structures.
Figure 6:
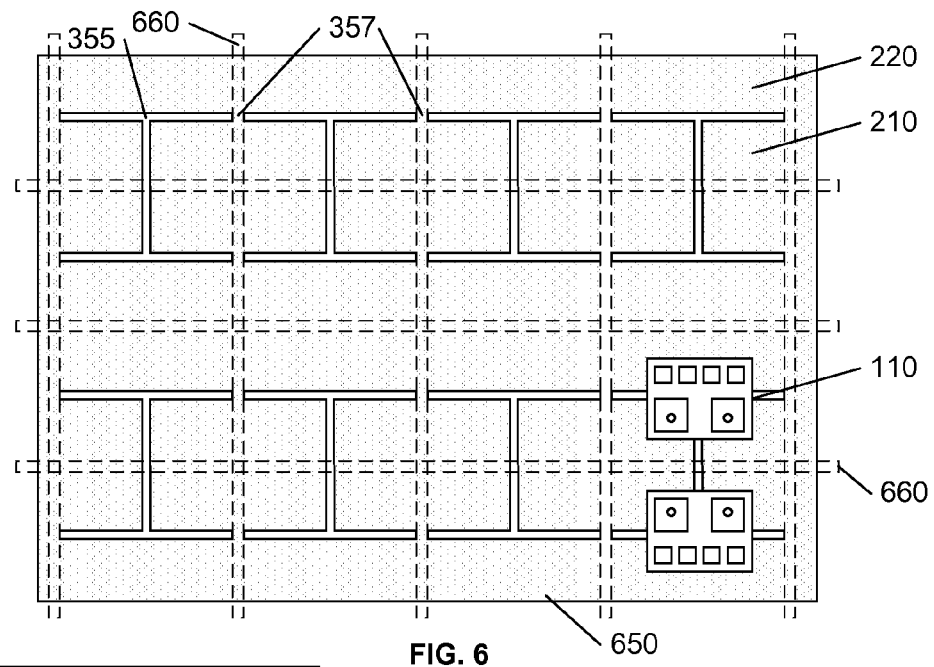
FIG. 6 illustrates another example lead frame that includes multiple carrier structures.

Although the example frame 350 is illustrated as forming one carrier structure 210-220, one of skill in the art will recognize that multiple carrier structures can be provided on a single frame, as illustrated in the example frames 550, 650 of FIGS. 5 and 6.

The example frame 550 includes a replication of the example frame 350 of FIG. 3. In this example, sixteen carrier structures 210-220 are provided in the frame 550, each carrier structure 210-220 having an attached LED die 110.

The example frame 650 is designed to minimize the waste material when the carrier structures 210-220 with attached LED dies 110 are removed from the frame. In this example, the carrier structures 210-220 are alternatively situated, to reduce the number of openings 355 required in the frame 650, and the tabs 357 that keep the regions 210, 220 attached to the frame 650 are located along saw kerfs 660 that will be produced when the carrier structures 210-220 are separated from the frame 650. In this example, sixteen light emitting devices (200 in FIG. 2) will be produced, but the size of the frame 650 is significantly smaller than the size of the frame 550 in FIG. 5.

Figure 7A:
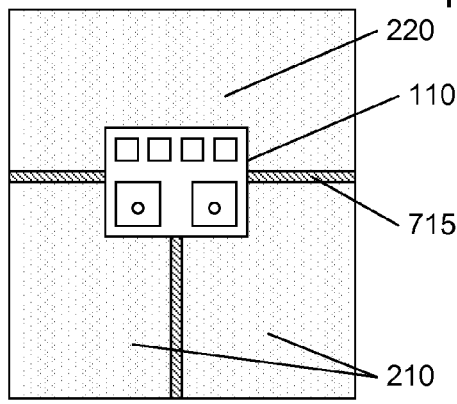
FIGS. 7A-7C illustrate example carrier structures.
Figure 7C:
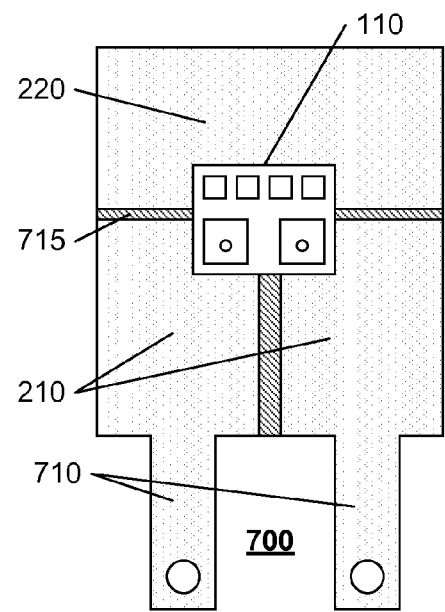
Figure 7B:

FIGS. 7A-7C illustrate example carrier structures. In these examples, the size of the carrier structures 210-220 is about the same size, relative to the die 110, as the substrate 150 in FIG. 1. To reduce the potential stress on the die 110 caused by these larger structures 210-220, the space between the conductors 210, 220 is filled with a dielectric material. In this manner, the structures 210-220 are substantially self-supporting, and place minimal stress on the die 110.

The dielectric may be added before or after the LED die 110 is attached to the carrier structures 210-220, and before or after the carrier structures 210-220 are separated from the frame, or a combination of both. For example, in FIG. 7B, the conductors 210 are isolated by the dielectric 715, and therefore at least a portion of the dielectric 715 must have been added after the conductors 210 are separated from the frame (at the locations of the tabs that had held the conductors 210 to the frame). However, the spaces between the conductors 210, 220 may be filled before the LED die 110 is attached to these conductors.

FIG. 7C illustrates the fact that the conductors 210 may provide additional functions. In this example, the conductors 210 include pin-shaped parts 710 that facilitate the insertion of the device 700 into a corresponding receptacle, such as holes in a printed circuit board, or a plug that allows the device 700 to be replaced.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

In interpreting these claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) each of the disclosed elements may be comprised of hardware portions (e.g., including discrete and integrated electronic circuitry), software portions (e.g., computer programming), and any combination thereof;

f) hardware portions may include a processor, and software portions may be stored on a non-transient computer-readable medium, and may be configured to cause the processor to perform some or all of the functions of one or more of the disclosed elements;

g) hardware portions may be comprised of one or both of analog and digital portions;

h) any of the disclosed devices or portions thereof may be combined together or separated into further portions unless specifically stated otherwise;

i) no specific sequence of acts is intended to be required unless specifically indicated; and j) the term "plurality of" an element includes two or more of the claimed element, and does not imply any particular range of number of elements; that is, a plurality of elements can be as few as two elements, and can include an immeasurable number of elements.

We claim:

1. A method comprising:
providing a lead-frame that includes at least one carrier element, the carrier element being conductive, and being partitioned to form a plurality of distinguishable conductive regions having a spatial relationship with each other,
placing at least one LED die on the carrier element, situated to extend across the plurality of conductive regions,
coupling contacts on the LED die directly to the conductive regions, and
separating the carrier element from the lead frame to provide an LED device with each of the conductive regions being electrically isolated from each other, the LED die serving to independently maintain the spatial relationship among the conductive regions;
wherein:
the plurality of distinguishable conductive regions include an anode region, a cathode region, and a heat transfer region, wherein
the anode and cathode regions are provided to facilitate coupling of anode and cathode electrodes associated with the LED die, respectively, and
after separating the carrier element from the lead frame, each of the anode, cathode, and heat transfer regions are separate regions that are electrically isolated from each other.

2. The method of claim 1, including placing a dielectric material between the distinguishable conductive regions.

3. The method of claim 1, including forming the lead frame by removing material from the lead frame in accordance with a pattern corresponding to the plurality of distinguishable conductive regions.

4. The method of claim 1, wherein the coupling includes reflow soldering.

5. The method of claim 1, wherein the lead frame comprises a copper sheet.

6. A light emitting device comprising:
a plurality of carrier elements, and
an LED die that extends across and is directly adhered to each of the plurality of carrier elements,
wherein:
the carrier elements provide:
primary structural support for the device, and
electrical and thermal coupling to the LED die;
and the LED die serves to maintain the spatial relationship among the carrier elements;
wherein the plurality of carrier elements include an anode element, a cathode element, and a heat transfer element;, wherein
the anode and cathode elements are provided to facilitate coupling of anode and cathode electrodes associated with the LED die, respectively; and
the anode, cathode and heat transfer elements are each separate elements that are electrically isolated from each other.

7. The light emitting device of claim 6, including dielectric material separating the carrier elements from each other.

8. The light emitting device of claim 6, wherein one or more of the carrier elements include a pin structure that facilitates insertion of the device in a corresponding receptacle.

9. The light emitting device of claim 6, wherein each of the carrier elements comprises copper.

10. The light emitting device of claim 6, wherein each of the carrier elements is at least 0.75mm thick.

11. The light emitting device of claim 6, wherein the LED die is adhered to the plurality of carrier elements with solder.

12. The light emitting device of claim 6, wherein the LED die includes one or more light emitting elements that emit light through a top surface of the LED die, and the LED die is adhered to the plurality of carrier elements via contacts on a bottom surface of the LED die, opposite the top surface.

13. A lead frame comprising:
at least one carrier element, the carrier element being conductive, and being partitioned to form a plurality of distinguishable conductive regions having a spatial relationship to each other, and
at least one LED die on the carrier element that extends over and is directly coupled to each of the plurality of distinguishable conductive regions so as to maintain the spatial relationship among the conductive regions;
wherein:
the plurality of distinguishable conductive regions include an anode region, a cathode region, and a heat transfer region;
the anode and cathode regions are provided to facilitate coupling of anode and cathode electrodes associated with the LED die, respectively; and
the carrier element includes tabs that couple the carrier element to the lead frame and are configured such that removal of the carrier element from the lead frame causes the anode, cathode, and heat transfer regions to be separate regions that are electrically isolated from each other.

14. The lead frame of claim 13, including dielectric material between the distinguishable conductive regions.

15. The lead frame of claim 13, wherein the lead frame is a copper sheet.

16. The lead frame of claim 13, wherein the lead frame is at least 0.75mm thick.

* * * * *